United States Patent
Kim

(10) Patent No.: US 11,716,893 B2
(45) Date of Patent: Aug. 1, 2023

(54) DISPLAY DEVICE

(71) Applicant: LG DISPLAY CO., LTD., Seoul (KR)

(72) Inventor: Hyeongseok Kim, Paju-si (KR)

(73) Assignee: LG DISPLAY CO., LTD.

( * ) Notice: Subject to any disclaimer, the term of this patent is extended or adjusted under 35 U.S.C. 154(b) by 0 days.

(21) Appl. No.: 18/071,357

(22) Filed: Nov. 29, 2022

(65) Prior Publication Data
US 2023/0088386 A1 Mar. 23, 2023

Related U.S. Application Data

(63) Continuation of application No. 17/138,151, filed on Dec. 30, 2020, now Pat. No. 11,538,869.

(30) Foreign Application Priority Data

Dec. 31, 2019 (KR) ........................ 10-2019-0179720

(51) Int. Cl.
*H10K 59/88* (2023.01)
*H10K 59/122* (2023.01)

(52) U.S. Cl.
CPC ........... *H10K 59/88* (2023.02); *H10K 59/122* (2023.02)

(58) Field of Classification Search
CPC ............................ H10K 59/88; H10K 29/122
See application file for complete search history.

(56) References Cited

U.S. PATENT DOCUMENTS

| | | |
|---|---|---|
| 2016/0190166 A1* | 6/2016 | Kim ...................... H01L 27/124 257/71 |
| 2016/0321992 A1 | 11/2016 | Kim et al. |
| 2020/0089369 A1 | 3/2020 | Bang et al. |
| 2020/0227503 A1 | 7/2020 | Yi et al. |
| 2020/0388230 A1 | 12/2020 | Lee |
| 2020/0401273 A1* | 12/2020 | Bang ...................... H10K 59/88 |

* cited by examiner

*Primary Examiner* — Kevin M Nguyen
(74) *Attorney, Agent, or Firm* — Polsinelli PC

(57) ABSTRACT

A display device includes a substrate including a display area having pixels disposed and a non-display area surrounding the display area and having a dummy pattern disposed; a light emitting layer formed on the pixels and the dummy pattern; and a bank surrounding the light emitting layer, wherein the dummy pattern includes a first dummy merge part extending along an X axis direction; and first sub-dummy parts extending from one side of the first dummy merge part to an outer region of the substrate along a Y axis direction perpendicular to the X axis direction.

20 Claims, 15 Drawing Sheets

DISPLAY DEVICE

CROSS-REFERENCE TO RELATED APPLICATIONS

This application is a continuation of U.S. patent application Ser. No. 17/138,151, filed on Dec. 30, 2020, which claims the priority benefit of Korean Patent Application No. 10-2019-0179720 filed on Dec. 31, 2019, which are hereby incorporated by reference in their entirety for all purposes as if fully set forth herein.

BACKGROUND

Field of the Disclosure

The present disclosure relates to a display device.

Description of the Background

As information society has developed, various types of display devices have been developed. Recently, various display devices such as a liquid crystal display (LCD), a plasma display panel (PDP), and an organic light emitting display (OLED) have been utilized.

The organic light emitting element constituting the organic light emitting display device is a self-emission type, and does not require a separate light source, so that the thickness and weight of the display device can be reduced. In addition, the organic light emitting display device exhibits high quality characteristics such as low power consumption, high luminance, and high reaction speed.

Recently, a technique for forming a light emitting layer of an organic light emitting element through a solution process using inkjet equipment has been developed. The solution process is performed in a way of applying a solution for forming a light emitting layer to a predetermined region and then drying the solution. Herein, the light emitting layer may not be properly formed in pixels provided in an outer region due to a dewetting phenomenon which occurs in the outer region of the solution, thereby causing pixel defects.

SUMMARY

Accordingly, the present disclosure is to provide a display device in which a dummy pattern is formed on an outer region of a display area where pixels are disposed, and a light emitting layer is formed from the display area to the dummy pattern through a solution process, thereby preventing a non-uniformity problem in light emission of pixels due to the dewetting phenomenon.

The present disclosure is also to provide a display device that prevents dewetting of the solution in a direction from the dummy pattern to the pixels, by using aggregation properties of the solution.

A display device according to an aspect of the present disclosure includes a substrate including a display area having pixels disposed and a non-display area surrounding the display area and having a dummy pattern disposed; a light emitting layer formed on the pixels and the dummy pattern; and a bank surrounding the light emitting layer, wherein the dummy pattern includes a first dummy merge part extending along an X axis direction; and first sub-dummy parts extending from one side of the first dummy merge part to an outer region of the substrate along a Y axis direction perpendicular to the X axis direction.

The first sub-dummy parts may be disposed corresponding to each of pixel columns.

A width of the first dummy merge part in the Y axis direction may correspond to a width of one pixel row in the Y axis direction; and a length of the first sub-dummy parts in the Y axis direction may correspond to a length of two or more pixel rows in the Y axis direction.

An area of the first dummy merge part may be larger than that of each of the first sub-dummy parts.

The dummy pattern may further include second sub-dummy parts extending from the other side of the first dummy merge part to the outer region of the substrate along the Y axis direction.

The first sub-dummy parts may be formed in one region of the first dummy merge part, and the first sub-dummy parts and the second sub-dummy parts may be formed in the other region of the first dummy merge part.

The dummy pattern may include a second dummy merge part disposed parallel to the first dummy merge part and extending along the X axis direction; and second sub-dummy parts extending from one side of the second dummy merge part to the outer region of the substrate along the Y axis direction.

The first dummy merge part and the second dummy merge part may be connected to each other in one region.

In the one region, the first sub-dummy parts may be formed in the first dummy merge part, and the second sub-dummy parts may be formed in the second dummy merge part.

The dummy pattern may further include a bar-shaped partition wall extending along the X axis direction.

The partition wall may be disposed to be spaced apart from the one region where the first dummy merge part and the second dummy merge part are connected to each other.

The partition wall may have hydrophobic properties.

The dummy pattern may further include a third dummy merge part extending along the Y axis direction; and a third sub-dummy parts extending from one side of the third dummy merge part to the outer region of the substrate along the X axis direction.

The third sub-dummy parts may be disposed corresponding to each of pixel rows.

A width of the third sub-dummy parts in a Y axis direction may correspond to a width of one pixel row in the Y axis direction.

The bank may include a first bank having hydrophilic properties; and a second bank formed on the first bank and having at least one region with hydrophobic properties.

The first bank may extend from the non-display area into the first sub-dummy parts.

The light emitting layer may be formed integrally in such a manner as to extend from any pixel column into the dummy pattern.

An edge region of the light emitting layer adjacent to the bank has a thickness larger than that of a center region of the light emitting layer far from the bank.

The display device may further include at least one circuit element formed on the substrate in the display area; an overcoat layer covering the at least one circuit element an anode electrode formed on the overcoat layer in the display area and having an edge covered by the bank, wherein the light emitting layer is formed on the anode electrode in the display area and formed on the dummy pattern in the non-display area; and a cathode electrode covering the light emitting layer and the bank.

In the display device according to the present disclosure, when forming the light emitting layer using a solution process, it is possible to prevent pixel defects in an outer region due to a dewetting phenomenon occurring in the outer region of the solution.

BRIEF DESCRIPTION OF THE DRAWINGS

The accompanying drawings, which are included to provide a further understanding of the disclosure and are incorporated in and constitute a part of this specification, illustrate aspects of the disclosure and, together with the description, serve to explain the principles of the disclosure.

In the drawings.

DETAILED DESCRIPTION

Figure 1:
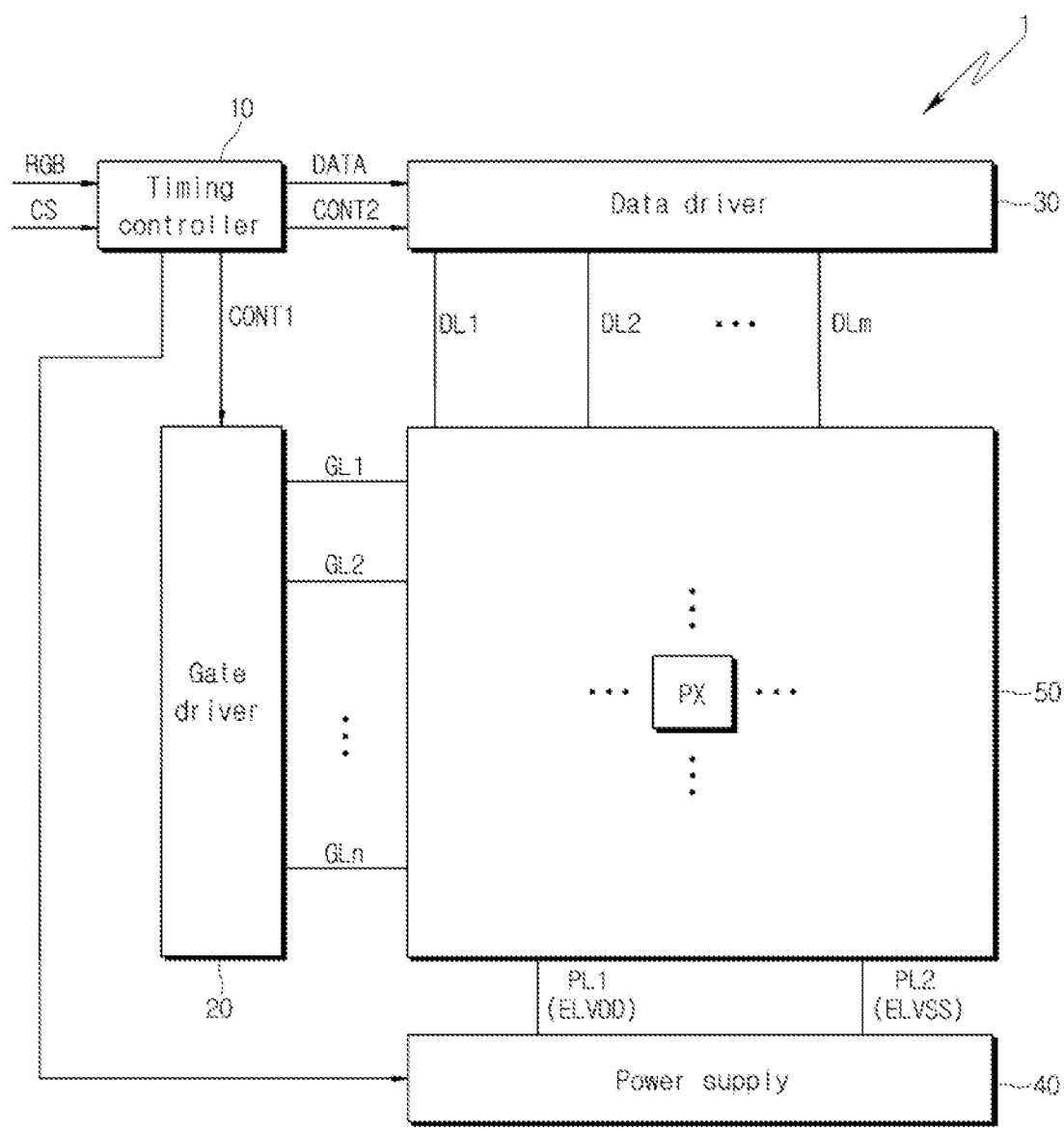
FIG. 1 is a block diagram illustrating a configuration of a display device according to an aspect of the present disclosure.

Hereinafter, aspects according to the present disclosure will be described with reference to the accompanying drawings. In this specification, when a component (or region, layer, part, etc.) is referred to as being "on", "connected" to, or "joined" to another component, it means that the component may be directly connected/coupled to another component or the component can be connected/coupled to another component with a third component in between.

The same reference numbers refer to the same components. In addition, in the drawings, the thickness, ratio, and dimensions of the components are exaggerated for effective description of technical content. Terms "and/or" include one or more combinations capable of being defined by associated configurations.

Terms such as "first" and "second" may be used to describe various components, but the components are not limited by the terms. The terms are used only for the purpose of distinguishing one component from other components. For example, the first component may be referred to as a second component without departing from the scope of rights of various aspects, and similarly, the second component may also be referred to as a first component. Singular expressions include plural expressions unless the context clearly indicates otherwise.

The terms such as "below", "lower", "above", "upper", etc. are used to describe the association of the components shown in the drawings. The terms are relative concepts and are explained on the basis of the directions indicated in the drawings.

It should be understood that terms such as "comprise" or "have" is intended to designate the presence of features, numbers, steps, operations, components, parts or combinations thereof described in the specification, but not to exclude the possibility of the presence or addition of one or more other features or numbers, steps, operations, components, parts, or combinations thereof.

FIG. 1 is a block diagram illustrating a configuration of a display device according to an aspect of the present disclosure.

Referring to FIG. 1, the display device 1 may include a timing controller 10, a gate driver 20, a data driver 30, a power supply 40, and a display panel 50.

The timing controller 10 may receive an image signal RGB and a control signal CS from the outside. The image signal RGB may include a plurality of pieces of gradation data. The control signal CS may include, for example, a horizontal synchronization signal, a vertical synchronization signal, and a main clock signal.

The timing controller 10 processes the image signal RGB and the control signal CS in such a manner as to be suitable for operating conditions of the display panel 50, to generate and output an image data DATA, a gate driving control signal CONT1, a data driving control signal CONT2, and a power supply control signal CONT3.

The gate driver 20 may be connected to pixels PXs of the display panel 50 through a plurality of first gate lines GL11 to GL1n. The gate driver 20 may generate gate signals on the basis of the gate driving control signal CONT1 output from the timing controller 10. The gate driver 20 may provide the generated gate signals to the pixels PXs through the plurality of first gate lines GL11 to GL1n.

The data driver 30 may be connected to the pixels PXs of the display panel 50 through a plurality of data lines DL1 to DLm. The data driver 30 may generate data signals on the basis of the image data DATA and the data driving control signal CONT2 output from the timing controller 10. The data driver 30 may provide the generated data signals to the pixels PXs through the plurality of data lines DL1 to DLm.

According to various aspects, the data driver 30 may be further connected to the pixels PXs of the display panel 50 through a plurality of sensing lines (or reference lines) SL1 to SLm. The data driver 30 may provide a reference voltage (or a sensing voltage, an initialization voltage) to the pixels PXs through the plurality of sensing lines SL1 to SLm, or sense states of the pixels PXs on the basis of electrical signals fed back from the pixels PXs.

The power supply 40 may be connected to the pixels PXs of the display panel 50 through a plurality of power lines PL1 and PL2. The power supply 40 may generate a driving voltage to be provided to the display panel 50 on the basis of the power supply control signal CONT3. The driving voltage may include, for example, a high potential driving voltage ELVDD and a low potential driving voltage ELVSS. The power supply 40 may provide the generated driving voltages ELVDD and ELVSS to the pixels PXs through corresponding power lines PL1 and PL2.

A plurality of pixels PXs (or referred to as sub-pixels) is disposed on the display panel 50. The pixels PXs may be arranged in the form of a matrix on the display panel 50, for example.

Each pixel PX may be electrically connected to a corresponding gate line and data line. The pixels PXs may emit light with luminance corresponding to the gate signals and the data signals supplied through the gate lines GL1 to GLn and the data lines DL1 to DLm.

Each pixel PX may display any one of first to third colors. According to an aspect, each pixel PX may display any one of red, green, and blue colors. According to another aspect, each pixel PX may display any one of cyan, magenta, and yellow colors. According to various aspects, the pixels PXs may be configured to display any one of four or more colors. For example, each pixel PX may display any one of red, green, blue, and white colors.

The timing controller 10, the gate driver 20, the data driver 30, and the power supply 40 may be each formed in a separate integrated circuit (IC), or at least a part of the timing controller 10, the gate driver 20, the data driver 30, and the power supply 40 may be formed in an integrated circuit. For example, at least one of the data driver 30 and the power supply 40 may be composed of an integrated circuit combined with the timing controller 10.

In addition, in FIG. 1, the gate driver 20 and the data driver 30 are shown as separate components from the display panel 50, but at least one of the gate driver 20 and the data driver 30 may be integrally formed with the display panel 50 by in-panel method. For example, the gate driver 20 may be integrally formed with the display panel 50 according to a gate in panel (GIP) method.

Figure 2:
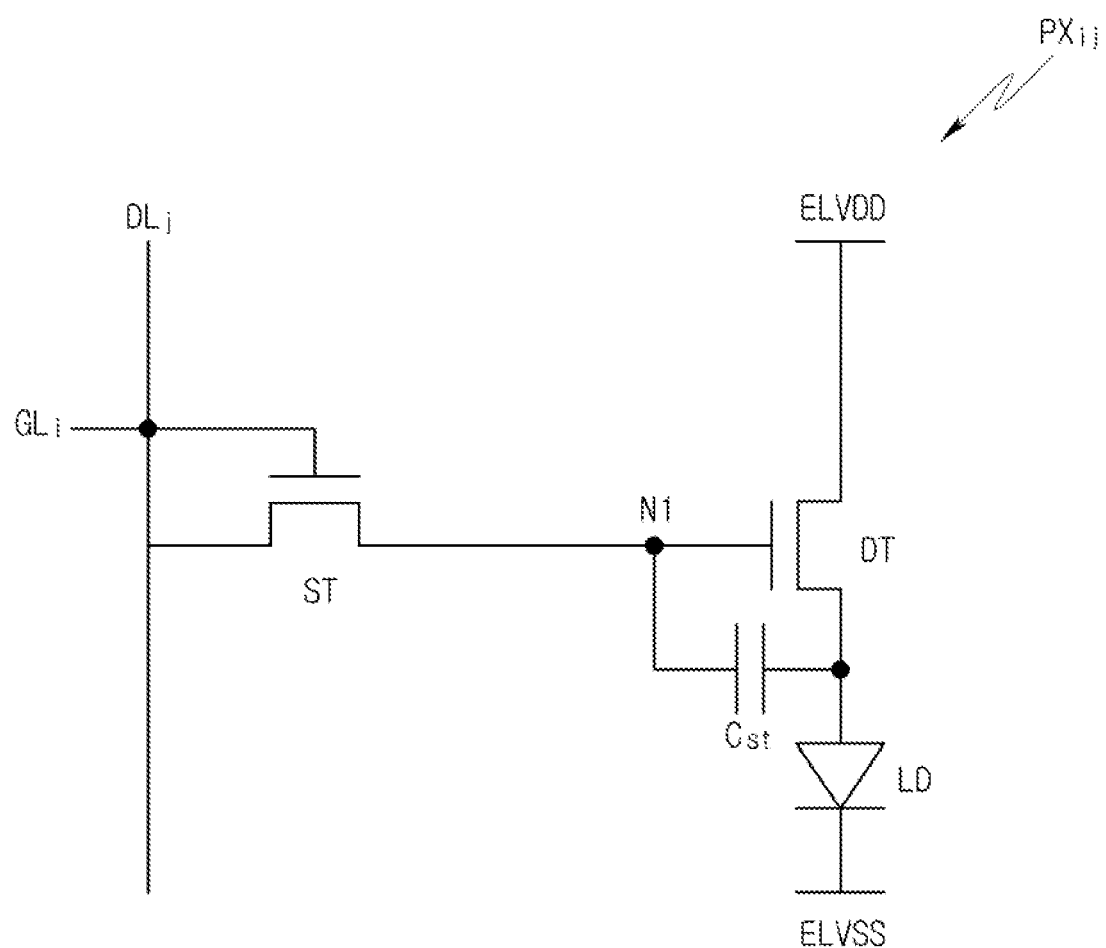
FIG. 2 is a circuit diagram illustrating a pixel illustrated in FIG. 1.

FIG. 2 is a circuit diagram illustrating an aspect of the pixel illustrated in FIG. 1. FIG. 2 illustrates an example of a pixel PXij connected to the i-th gate line GLi and the j-th data line DLj.

Referring to FIG. 2, the pixel PXij includes a switching transistor ST, a driving transistor DT, a sensing transistor SST, a storage capacitor Cst, and a light emitting element LD.

In the switching transistor ST, a first electrode (e.g., source electrode) is electrically connected to the j-th data line DLj, and a second electrode (e.g., drain electrode) is electrically connected to a first node N1. A gate electrode of the switching transistor ST is electrically connected to the i-th gate line GLi. When a gate signal of a gate-on level is applied to the i-th gate line GLi, the switching transistor ST is turned on, to transmit a data signal V_data applied to the j-th data line DLj to the first node N1.

The storage capacitor Cst is configured to have a first electrode electrically connected to the first node N1, and a second electrode receiving a high potential driving voltage ELVDD. The storage capacitor Cst may charge a voltage corresponding to a difference between the voltage applied to the first node N1 and the high potential driving voltage ELVDD.

The driving transistor DT is configured to have a first electrode (e.g., source electrode) receiving the high potential driving voltage ELVDD, and a second electrode (e.g., drain electrode) electrically connected to a first electrode (e.g., anode electrode) of the light emitting element LD. The gate electrode of the driving transistor DT is electrically connected to the first node N1. When a voltage of the gate-on level is applied through the first node N1, the driving transistor DT is turned on to control an amount of driving current I_DS flowing through the light emitting element LD in correspondence with the voltage provided to the gate electrode.

The light emitting element LD outputs light corresponding to the driving current. The light emitting element LD may output light corresponding to any one of red, green, and blue colors. The light emitting element LD may be an organic light emitting diode OLED, or an ultra-small inorganic light emitting diode having a size ranging from micro to nanoscale, but is not limited thereto. Hereinafter, the technical idea of the present disclosure will be described with reference to an aspect in which the light emitting element LD is formed of an organic light emitting diode.

According to the present disclosure, the structure of the pixel PXij is not limited to that shown in FIG. 2. According to an aspect, the pixel PXij may further include at least one element for compensating a threshold voltage of the driving transistor DT or for initializing a voltage of a gate electrode of the driving transistor DT and/or a voltage of an anode electrode of the light emitting element LD.

FIG. 2 shows an example in which the switching transistor ST and the driving transistor DT are NMOS transistors, but the present aspect is not limited thereto. For example, at least a part of transistors constituting each pixel PXij may be composed of PMOS transistors. In various aspects, each of the switching transistor ST and the driving transistor DT may be implemented by a low temperature polysilicon (LTPS) thin film transistor, an oxide thin film transistor, or a low temperature polycrystalline oxide (LTPO) thin film transistor.

Figure 3:
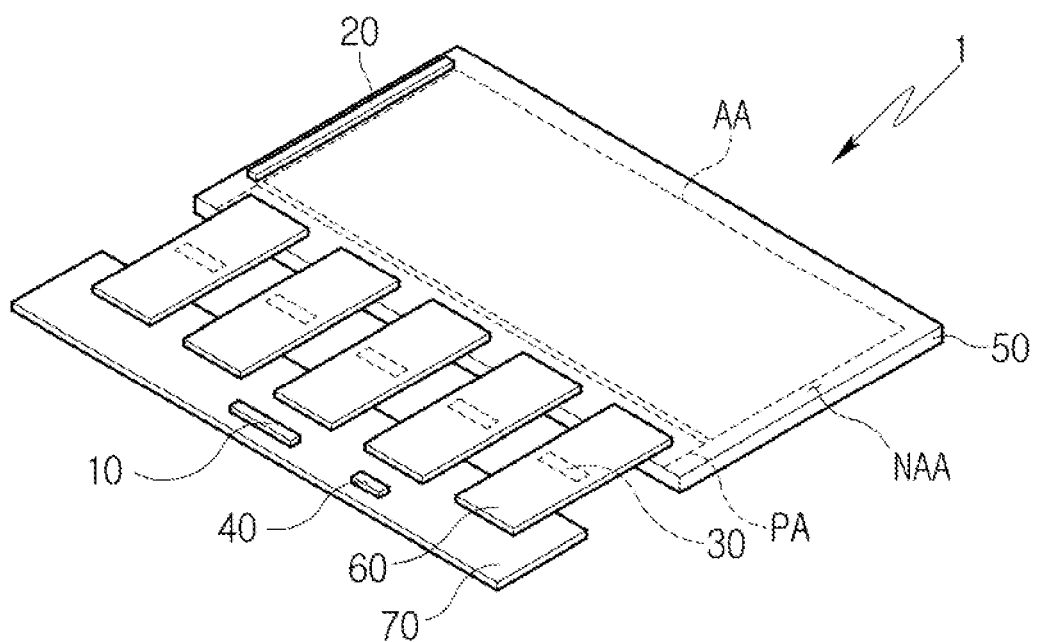
FIG. 3 is a schematic perspective view illustrating a display panel illustrated in FIG. 1.

FIG. 3 is a schematic perspective view illustrating a display panel illustrated in FIG. 1. Components of the display device 1 will be described in more detail with reference to FIGS. 1 and 2.

The display device 1 may be implemented in various forms. For example, the display device 1 may be implemented in a rectangular plate shape, but is not limited thereto. The display device 1 may have various shapes such as square, circular, elliptical, and polygonal shapes, and may have a part of an edge formed with a curved surface or have a shape in which thickness changes in at least one region thereof. In addition, all or a part of the display device 1 may have flexibility.

The display panel 50 includes a display area AA and a non-display area NAA. The display area AA is an area in which the pixels PXs are disposed, and may be referred to as an active area. The non-display area NAA may be disposed around the display area AA. For example, the non-display area NAA may be disposed along the border of the display area AA. The non-display area NAA may mean areas other than the display area AA on the display panel 50, and may be referred to as a non-active area.

The non-display area NAA may be provided with, for example, a gate driver 20, as a driver for driving the pixels PX. The gate driver 20 may be disposed adjacent to one side or both sides of the display area AA, in the non-display area NAA. The gate driver 20 may be formed in a gate-in-panel manner in a non-display area NAA of the display panel 50 as shown in FIG. 3. However, in another aspect, the gate driver 20 made of a driving chip may be mounted on a flexible film and the like, and then attached to the non-display area NAA by a tape automated bonding (TAB) method.

A plurality of pads (not shown) may be provided in the non-display area NAA. The pads are not covered by the insulating layer but exposed to the outside of the display panel 50, and thus electrically connected to a data driver 30, a circuit board 70, and the like, which will be described later.

The display panel 50 may include wires for supplying electrical signals to the pixels PX. The wires may include, for example, gate lines GL1 to GLn, data lines DL1 to DLm, and power lines PL1 and PL2.

The power lines PL1 and PL2 are electrically connected to the power supply 40 (or the timing controller 10) through the connected pads, thereby providing a high potential driving voltage ELVDD and a low potential driving voltage ELVSS provided from the power supply 40 (or the timing controller 10) to the pixels PXs.

A flexible film 60 has one end coupled to the pad area PA of the display panel 50 and the other end coupled to the circuit board 70, to allow the display panel 50 and the circuit board 70 to be electrically connected to each other. The flexible film 60 may include a plurality of wires for electrically connecting the pads formed in the pad area PA with wires of the circuit board 70. According to an aspect, the flexible film 60 may be coupled to the pads through an anisotropic conducting film (ACF).

When the data driver 30 is made of a driving chip, the data driver 30 may be mounted on the flexible film 60 in a chip on film (COF) method or chip on plastic (COP) method. The data driver 30 may generate a data signal on the basis of the image data DATA and the data driving control signal CONT2, which are received from the timing controller 10, and output the data signal to the data lines DL1 to DLm through the connected pad.

A plurality of circuits implemented in driving chips may be mounted on the circuit board 70. The circuit board 70 may be a printed circuit board or a flexible printed circuit board, but a type of the circuit board 70 is not limited thereto.

The circuit board 70 may include a timing controller 10 and a power supply 40 mounted in the form of an integrated circuit. The timing controller 10 and the power supply 40 are shown as separate components in FIG. 3, but this aspect is not limited thereto. That is, in various aspects, the power supply 40 may be integrally formed with the timing controller 10, or the timing controller 10 may be configured to perform a function of the power supply 40.

Figure 4:
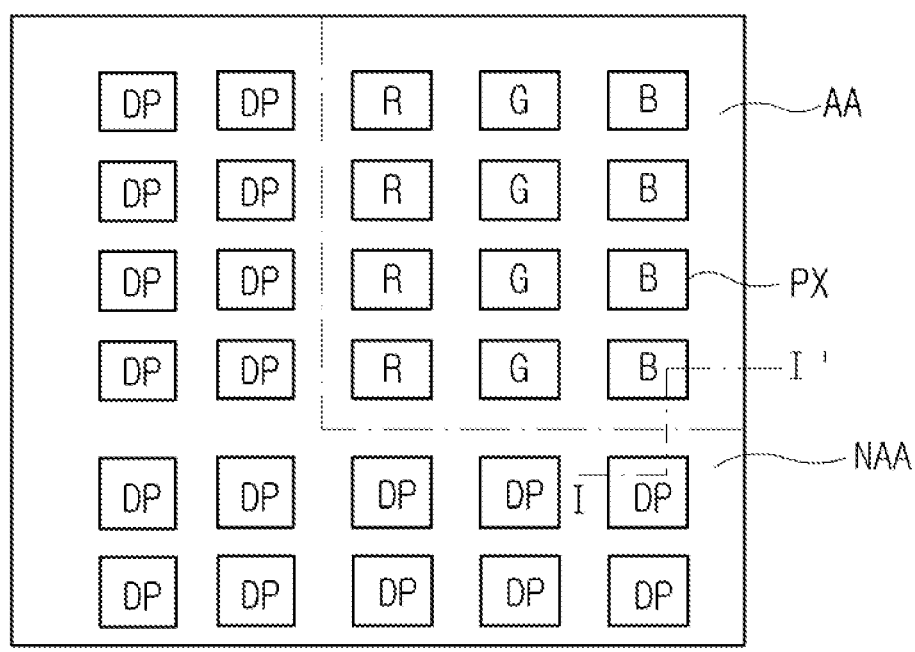
FIG. 4 is a schematic plan view illustrating an enlarged portion of a display area and a non-display area according to the present disclosure.
Figure 5:
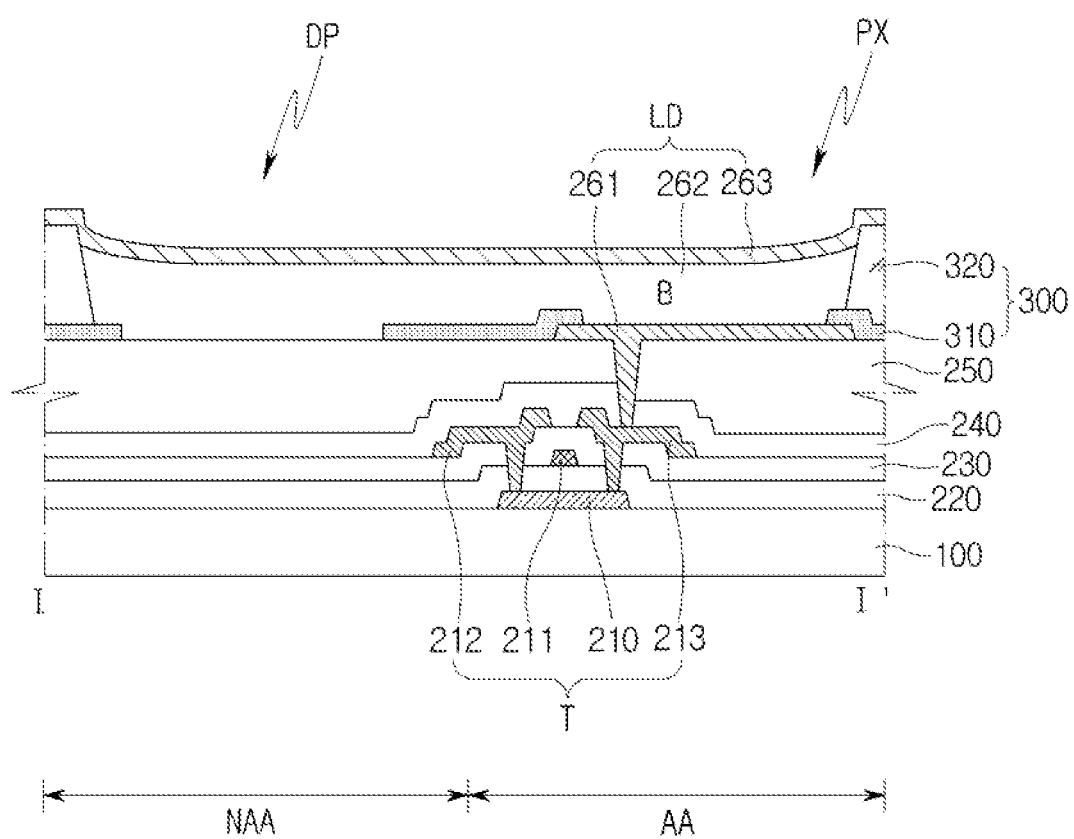
FIG. 5 is a cross-sectional view taken along line I-I' of FIG. 4.

FIG. 4 is a schematic plan view illustrating an enlarged portion of a display area and a non-display area according to an aspect. FIG. 5 is a cross-sectional view taken along a line I-I' of FIG. 4.

Referring to FIG. 4, pixels PXs may be arranged in a matrix form in which a plurality of pixel rows and a plurality of pixel columns are aligned in the display area AA. Herein, the same pixels PXs are arranged in one pixel column. R, G, and B pixels may be repeatedly arranged in sequence in one pixel row (stripe type). However, the present aspect is not limited thereto, and in various other aspects, R, G, B, and G pixels may be repeatedly arranged in one pixel row in sequence (PenTile type).

Dummy patterns DP may be formed in the non-display area NAA. The dummy patterns DP may be disposed in one end or both ends of the pixel rows and pixel columns, which are disposed in the display area AA, in alignment with corresponding pixel row and/or pixel columns.

In FIG. 4, the dummy patterns DP are shown as having a rectangular shape. However, the shape of the dummy patterns DP is not limited thereto. In various aspects to be described below, the dummy patterns DP may have a pattern in which a plurality of dummy patterns DP shown in FIG. 4 are merged.

Hereinafter, a laminated structure of the display panel 50 will be described.

Referring to FIG. 5, the substrate 100 is a base substrate of the display panel 50 and may be a transparent substrate. The substrate 100 may be a rigid substrate including glass or tempered glass, or a flexible substrate made of plastic.

According to an aspect, a buffer layer (not shown) may be formed on the substrate 100. The buffer layer may prevent ions or impurities from diffusing form the substrate 100 and block moisture penetration.

The substrate 100 may include a display area AA and a non-display area NAA. A circuit element layer and a light emitting element layer may be formed on the display area AA on the substrate 100.

The circuit element layer may include circuit elements (e.g., a switching transistor ST, a driving transistor DT, and a storage capacitor Cst) constituting the pixel PXij and signal lines. When the buffer layer is formed, the circuit element layer may be formed on the buffer layer.

First, an active pattern 210 may be formed on the substrate 100. The active pattern 210 may be formed of a silicon-based semiconductor material or an oxide-based semiconductor material.

A gate insulating layer 220 may be formed on the active pattern 210, and a gate electrode 211 may be formed on the gate insulating layer 220. An interlayer insulating layer 230 may be formed on the gate electrode 211, and a source electrode 212 and a drain electrode 213 may be formed on the interlayer insulating layer 230. The source electrode 212 and the drain electrode 213 may be connected to the active pattern 210 through a contact hole passing through the interlayer insulating layer 230 and the gate insulating layer 220.

The source electrode 212, the drain electrode 213, the gate electrode 211, and the active pattern 210 corresponding thereto may constitute a transistor T. The transistor T may be, for example, a driving transistor DT or a switching transistor ST. In FIG. 5, a driving transistor DT in which the drain electrode 213 is connected to a first electrode 261 of a light emitting element LD is illustrated as an example.

A passivation layer 240 may be formed on the source electrode 212 and the drain electrode 213. The passivation layer 240 is an insulating layer for protecting the underlying elements, and may be formed of an inorganic material or an organic material.

An overcoat layer 250 may be formed on the passivation layer 240. The overcoat layer 250 may be a planarization film for alleviating a difference in level of the underlying structure.

Various signal lines and circuit elements such as capacitors, which are not shown, may be further formed in the circuit element layer. The signal lines may include, for example, the gate line GL and the data line DL described with reference to FIGS. 1 and 2.

A light emitting element layer is formed on the overcoat layer 250 and includes light emitting elements LDs. The light emitting element LD includes a first electrode 261, a light emitting layer 262, and a second electrode 263. The first electrode 261 may be an anode electrode and the second electrode 263 may be a cathode electrode.

The first electrode 261 is formed on the overcoat layer 250. The first electrode 261 is connected to the drain electrode 213 of the transistor T through a via hole passing through the overcoat layer 250 and the passivation layer 240.

A bank 300 is further formed on the overcoat layer 250. The bank 300 may be formed to cover a part of an edge of the first electrode 261 in the display area AA.

In various aspects, the bank 300 may include a first bank 310 having hydrophilic properties and a second bank 320 having hydrophobic properties. The second bank 320 may be patterned through a photolithography process after applying a solution obtained by mixing a hydrophobic material such as fluorine with an organic insulating material having hydrophilic properties. A hydrophobic material such as fluorine may move to the top portion of the second bank 320 by irradiation light during the photolithography process, and the top portion of the second bank 320 may have hydrophobic properties. However, this aspect is not limited thereto, and the entire portion of the second bank 320 may be formed to have hydrophobic properties.

According to an aspect, the first bank 310 may be formed to have a smaller thickness than the second bank 320, and formed to have a wider width than the second bank 320. The first bank 310 may be arranged in a lattice form to surround each pixel PX, and the second bank 320 may be arranged to surround each pixel column. When the light emitting layer 262 to be described later is formed by a solution process, the solution may be easily spread in a pixel column direction by the first bank 310 having hydrophilic properties, and the solution may be prevented from mixing between the pixel columns by the second bank 320 having hydrophobic properties.

The light emitting layer 262 is formed on the first electrode 261. The light emitting layer 262 is formed on a partial region of the first electrode 261, which is not covered by the bank 300 but exposed. That is, the light emitting layer 262 is surrounded by the bank 300.

The light emitting layer 262 may have a multi-layer thin film structure including a light generating layer. For example, the light emitting layer 262 may include a hole transport layer (HTL), an organic light emitting layer, and an electron transport layer (ETL). In addition, the light emitting layer 262 further includes a hole injection layer (HIL), a hole blocking layer (HBL), an electron injection layer (EIL) and an electron blocking layer (EBL).

According to this aspect, the light emitting layer 262 may be formed by a solution process using inkjet equipment or the like. In particular, the light emitting layer 262 may be formed for pixels PXs of the same color disposed in the same pixel column, in a single solution process. In this aspect, the inkjet equipment may move on the first electrodes 261 disposed in the same pixel column while dropping solutions. When the dropped solutions are dried, the light emitting layer 262 integrated into one is formed for the pixel column.

When the light emitting layer 262 is formed by the solution process, a difference in thickness may occur between a center region of the light emitting layer 262 and an edge region adjacent to the bank 300 due to the tension between the solution and the bank 300. For example, the light emitting layer 262 may be formed in a concave shape having the thinnest thickness in the center and the thickest thickness in a region in contact with the bank 300, but this aspect is not limited thereto. That is, according to various other aspects, structures for improving thickness uniformity of the light emitting layer 262 may be provided, and the light emitting layer 262 may have a uniform thickness in the entire area.

The second electrode 263 is formed on the light emitting layer 262 and the bank 300. That is, the second electrode 263 may be formed to cover the light emitting layer 262 and the bank 300.

Although not illustrated, an encapsulation layer may be formed on the second electrode 263. The encapsulation layer serves to prevent external moisture from penetrating into the light emitting layer 262. The encapsulation layer may be formed of an inorganic insulating material, or may be formed of a structure in which an inorganic insulating material and an organic insulating material are alternately stacked, but is not limited thereto.

The circuit element layer, the light emitting layer 262, the second electrode 263, the bank 300, and the encapsulation layer may be formed in the non-display area NAA on the substrate 100.

The circuit element layer on the non-display area NAA has the same structure as the circuit element layer formed in the display area AA, whereby the formation through the same single process is possible. However, at least a part or all of signal lines and circuit elements may not be formed on the circuit element layer in the non-display area NAA.

The bank 300 is formed on the overcoat layer 250 of the circuit element layer. In the non-display area NAA, the bank 300 may be a definition layer defining the shape of the dummy pattern DP.

The light emitting layer 262 is further formed on the overcoat layer 250. The light emitting layer 262 is formed on the overcoat layer 250, which is not covered by the bank 300 but exposed. That is, the light emitting layer 262 is formed in the dummy pattern DP defined by the bank 300 and is surrounded by the bank 300.

Unlike the display area AA, the circuit element layer in the non-display area NAA is not provided with at least a part or all of signal lines and circuit elements. In addition, as illustrated, the dummy pattern DP does not include the first electrode 261. Accordingly, the light emitting layer 262 constituting the dummy pattern DP does not emit light.

The light emitting layer 262 of the dummy patterns DPs may be formed through a single solution process, together with the light emitting layer 262 of the corresponding pixel columns. Inkjet equipment may move along one pixel column from the display area AA to the non-display area NAA while dropping solutions on the pixels PXs disposed in the corresponding pixel column and dummy patterns DPx disposed adjacent to the corresponding pixel column. Thereafter, when the dropped solutions are dried, the light emitting layer 262 may be integrally formed for the pixels PXs and the dummy patterns DP.

As described above, the light emitting layer 262 may have a thickness difference between the center region of the light emitting layer 262 and the edge region adjacent to the bank 300 due to tension between the solution and the bank 300.

The second electrode 263 and the encapsulation layer may be formed on the light emitting layer 262. The second electrode 263 and the encapsulation layer may be formed through a single process with the same structure as the second electrode 263 and the encapsulation layer formed in the display area AA. That is, the second electrode 263 and the encapsulation layer may be formed with a structure extending from the display area AA to the non-display area NAA. However, in various aspects, the second electrode 263 may not be formed in the non-display area NAA.

In the structure of the display panel 50 as described above, the dummy pattern DP is provided to solve the light emission imbalance between the center portion and the outer portion of the pixel column in the display area AA. As described above, the light emitting layer 262 may be formed through a single solution process for one pixel column and dummy pattern DP corresponding thereto. When the solution dries, a dewetting phenomenon may occur in which the solution dries from the outer portion. When the degree of dewetting is large, the light emitting layer 262 is not correctly formed in predetermined pixels disposed on the outer portion of the pixel column (i.e., both ends of the pixel column), whereby pixel defects may occur.

In order to prevent such a problem, the solution may be dropped to the dummy pattern DP beyond the pixel column region. Then, since the dewetting phenomenon occurs in the dummy pattern DP, pixel defects in the display area AA may be prevented.

In the following aspects, various forms of the dummy pattern DP capable of more effectively preventing pixel defects due to the dewetting phenomenon are proposed.

Figure 6:
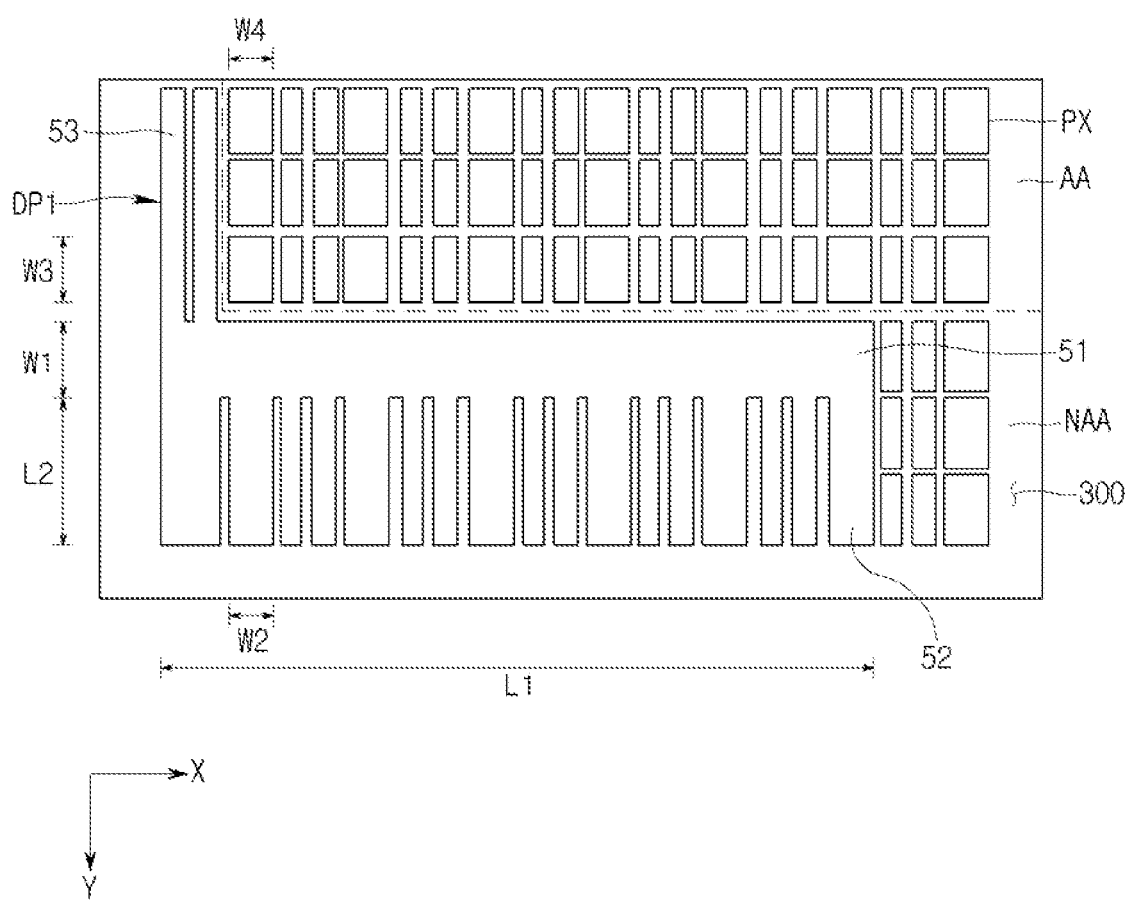
FIG. 6 is a plan view illustrating a dummy pattern according to a first aspect of the present disclosure.
Figure 7:
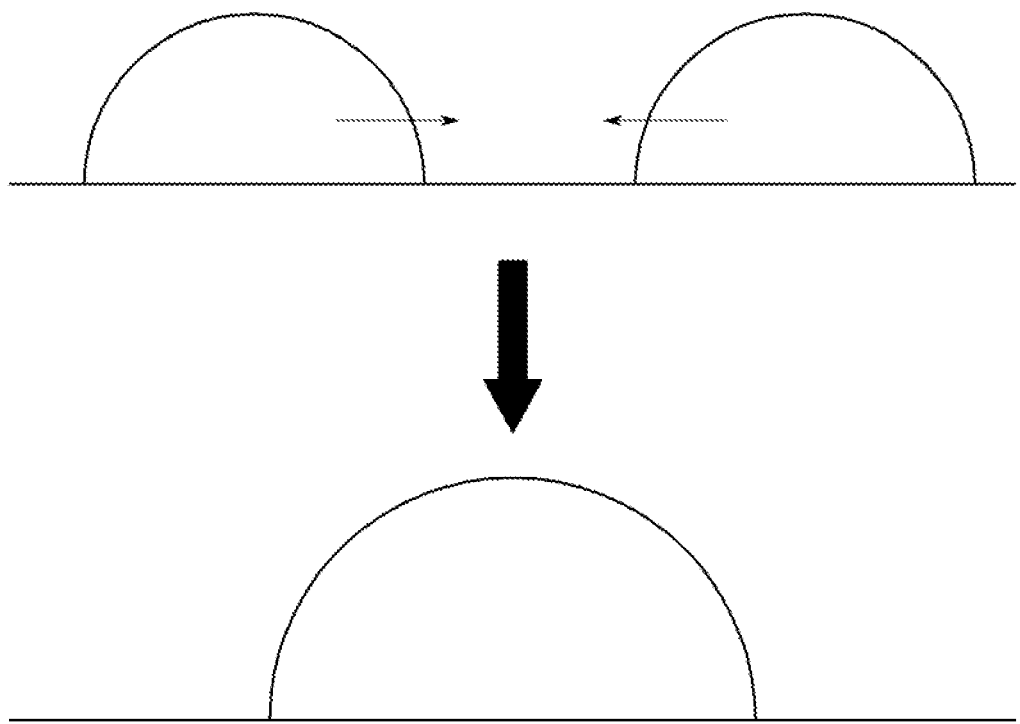
FIGS. 7 and 8 are views illustrating aggregation characteristics of the solution.
Figure 8:
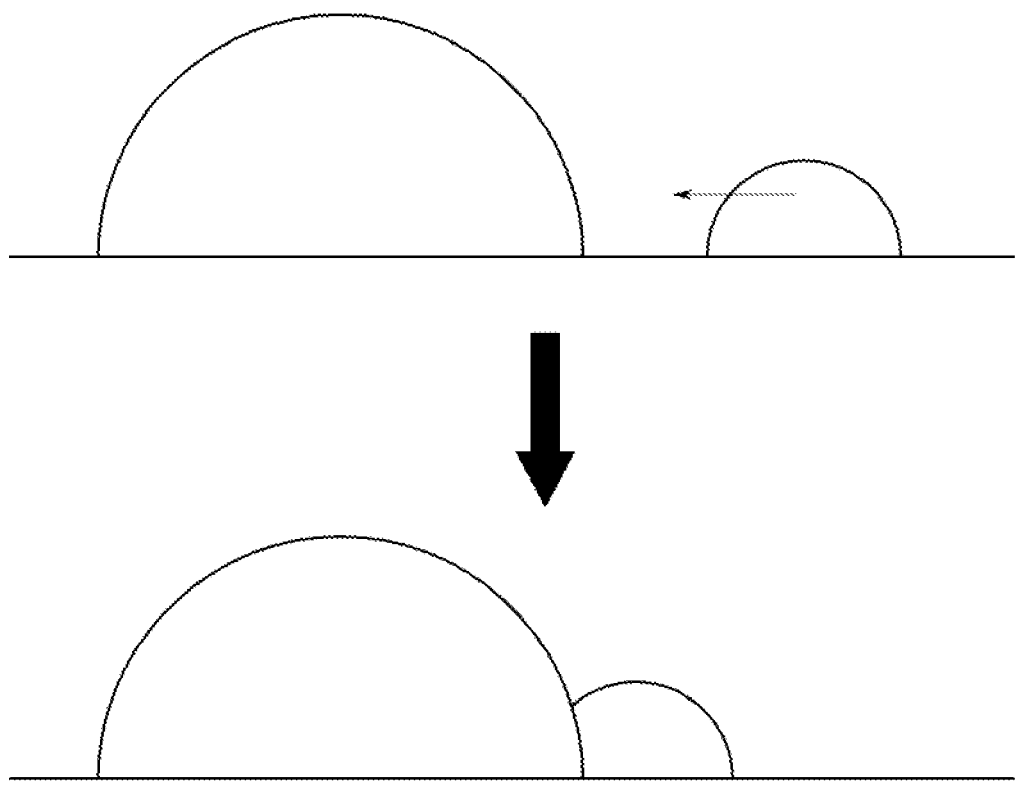
Figure 9:
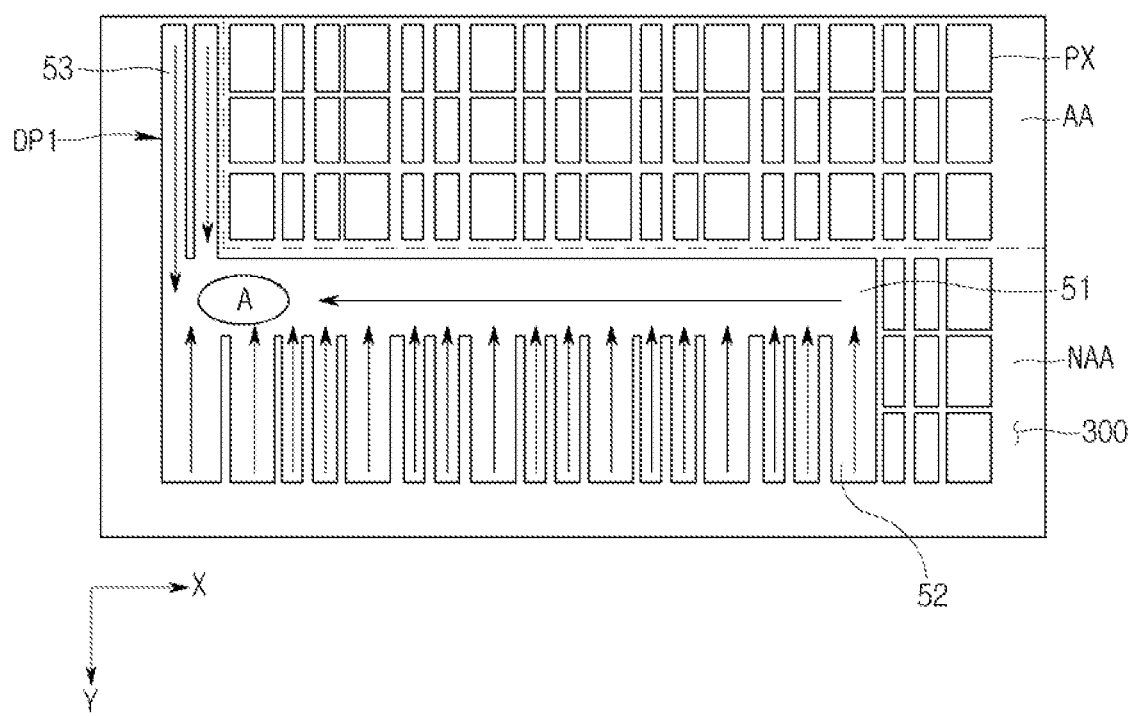
FIG. 9 is a view illustration an aggregation direction of the solution in the dummy pattern shown in FIG. 6.

FIG. 6 is a plan view illustrating a dummy pattern according to a first aspect. FIGS. 7 and 8 are views illustrating aggregation properties of the solution. FIG. 9 is a view illustration an aggregation direction of the solution in the dummy pattern shown in FIG. 6.

Referring to FIG. 6, pixels PXs in the display area AA are disposed in a matrix form aligned in an X axis direction and a Y axis direction.

In the non-display area NAA, the dummy pattern DP1 includes a dummy merge part 51 extending in the X axis direction and a plurality of first and second sub-dummy parts 52 and 53 extending in the Y axis direction from one side of the dummy merge part 51.

The dummy merge part 51 may have a bar shape extending along the X axis. A width W1 of the dummy merge part 51 in the Y axis direction may be the same or similar to a width W3 in the Y axis direction of one pixel row. The dummy merge part 51 may be extended to a length L1 corresponding to a plurality of pixel columns. The dummy merge part 51 may be extended to a length L1 corresponding to all of the pixel columns or a part of the pixel columns disposed in the display area AA.

The sub-dummy parts 52 and 53 have one end connected to the dummy merge part 51, and may have a bar shape extending to the outside of the display panel 50 (i.e., the substrate 100) along the Y axis. The sub-dummy parts 52 and 53 may be formed on one side or both sides of the dummy merge part 51. That is, the first sub-dummy parts 52 are formed on one side in one region of the dummy merge part 51, and the first and second sub-dummy parts 52 and 53 may be formed on both sides in the other region of the dummy merge part 51.

The first sub-dummy parts 52 may be each disposed corresponding to each pixel column. In this aspect, a width W2 of the first sub-dummy part 52 in the X axis direction may be the same or similar to a width W4 of the corresponding pixel column in the X axis direction.

An extended length L2 of the sub-dummy parts 52 and 53 may be determined in consideration of the size and shape of the non-display area NAA, and the thickness of the bezel of the display device 1. According to an aspect, in order to stably remove pixel defects in the display area AA due to the dewetting phenomenon, the extended length L2 of the sub-dummy parts 52 and 53 may correspond to a length of two or more pixel rows in the Y axis direction.

When the light emitting layer 262 is formed on the pixels PXs through the solution process in the display area AA, solutions are also dropped on the dummy pattern DP1. For example, when the first solution is dropped to form the light emitting layer 262 of red color in the first pixel column, the first solution is dropped along the first pixel column from the display area AA to the dummy pattern DP1; when the second solution is dropped to form the light emitting layer 262 of green color in the second pixel column, the second solution are dropped along the second pixel column from the display area AA to the dummy pattern DP1; and when the third solution is dropped to form the light emitting layer 262 of blue color in the third pixel column, the third solution is dropped along the third pixel column from the display area AA to the dummy pattern DP1. The first to third solutions dropped on the dummy patterns DP1 are bonded to each other by mutual tension in the dummy pattern DP1.

In the case that the solutions are combined with each other, when the amounts of solutions are the same or similar to each other, the magnitudes of tensions between the solutions is similar to each other. Thus, the solutions are combined to each other at an intermediate point as shown in FIG. 7. However, when the amount of one solution is larger than the other, the magnitudes of tensions between the solutions are different from each other. Herein, as shown in FIG. 8, a small amount of a solution moves toward a larger amount of solution, and then two solutions are combined.

In the shown dummy pattern DP1, the dummy merge part 51 is connected to the plurality of sub-dummy parts 52 and 53, so that the area thereof is wider than that of each of the sub-dummy parts 52 and 53. The dummy merge part 51 with a larger area has a larger amount of solution dropped than each of the sub-dummy parts 52 and 53.

Referring to FIG. 9, by the mutual tension described above, the solutions dropped on the sub-dummy parts 52 and 53 receives tension in the direction of the dummy merge part 51. A part of the solutions dropped on the sub-dummy parts 52 and 53 may move toward the dummy merge part 51 and thus combined with the solutions dropped on the dummy merge part 51.

In the dummy merge part 51, a larger amount of solution is introduced into a region A where the sub-dummy parts 52 and 53 are formed on both sides than a region where the sub-dummy parts 52 are formed on one side. Thus, the solution receives tension in the direction of the region A within the dummy merge part 51.

As described above, according to the shape of the dummy pattern DP1, the solution receives tension in the direction of the region A, that is, away from the display area AA. Accordingly, the largest amount of solution per an area may be applied to the region A of the dummy merge part 51. When the solution is dried, the drying rate in the region A where the amount of the solution is larger is relatively slow. As the solution dries relatively slowly in the region A adjacent to the outermost region of the display panel 50, it is possible to prevent dewetting in the direction of the display region AA.

According to an aspect, the dummy patterns DP1 illustrated in FIG. 6 and the dummy patterns DP illustrated in FIG. 4 may be formed on one display panel 50 in combination, but is not limited thereto.

Figure 10:
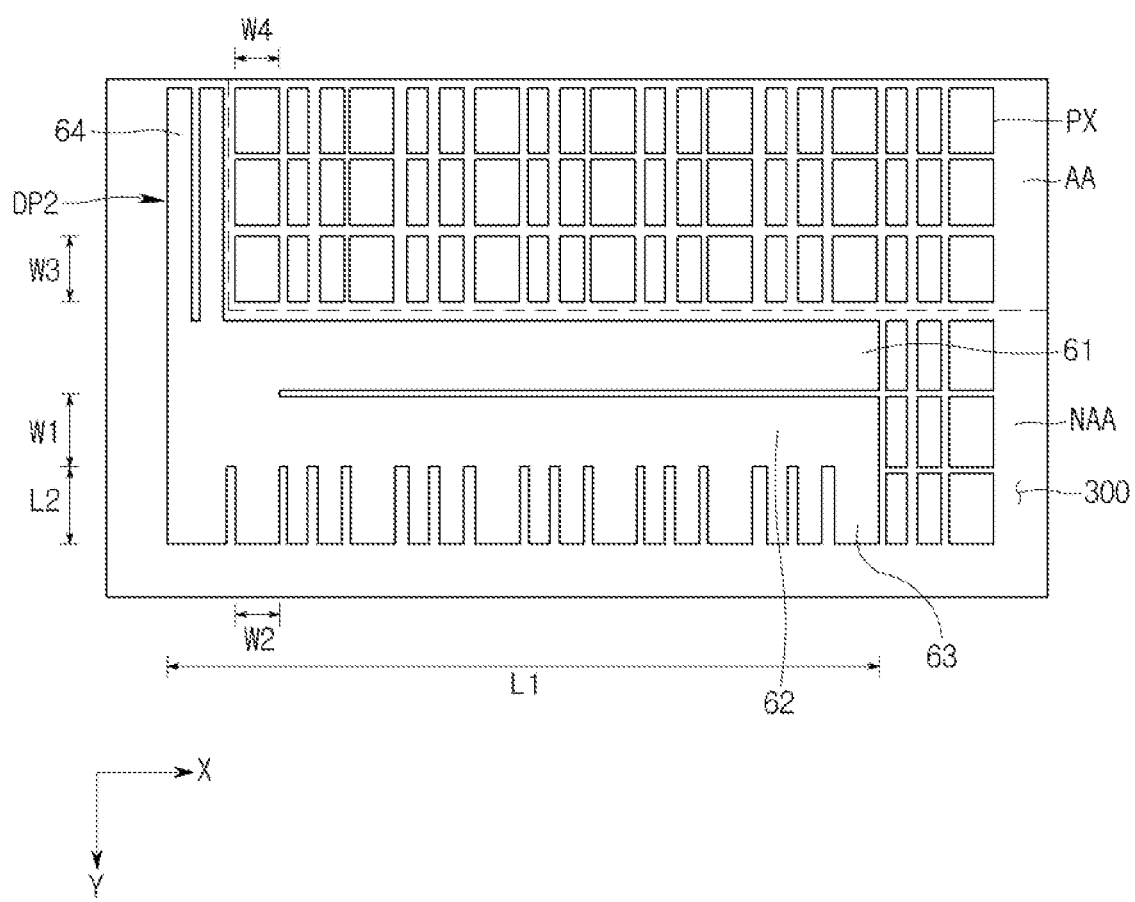
FIG. 10 is a plan view illustrating a dummy pattern according to a second aspect of the present disclosure.
Figure 11:
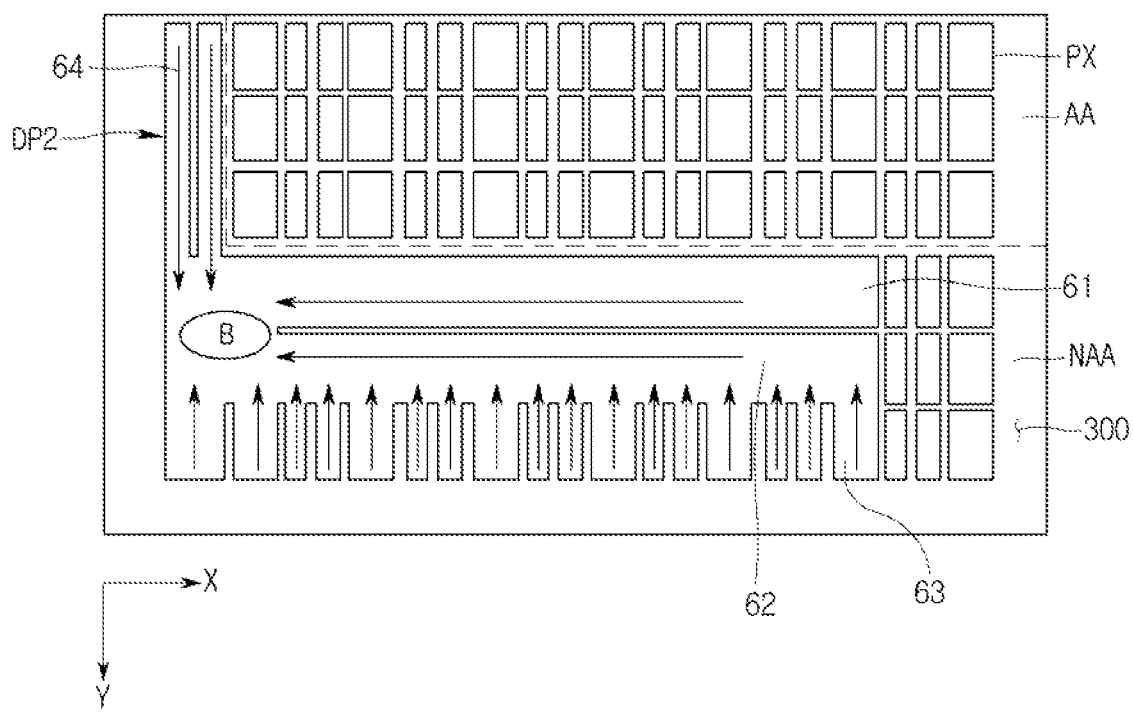
FIG. 11 shows an aggregation direction of solution in the dummy pattern shown in FIG. 10.

FIG. 10 is a plan view illustrating a dummy pattern according to a second aspect. FIG. 11 shows an aggregation direction of solution in the dummy pattern shown in FIG. 10.

Compared to the aspect shown in FIG. 6, the dummy pattern DP2 in the second aspect includes a plurality of dummy merge parts 61 and 62 extending in the X axis direction and disposed parallel to each other. One end of each of the dummy merge parts 61 and 62 may be connected to each other.

A width W1 of each of the dummy merge part 61 and 62 in the Y axis direction may be the same or similar to a width W3 of one pixel row in the Y axis direction. In addition, each dummy merge part 61 or 62 may be extended to a length L1 corresponding to all of the pixel columns or a part of the pixel columns disposed in the display area AA.

A plurality of sub-dummy parts 63 and 64 extending from the dummy merge parts 61 and 62 along the Y axis may be formed on one or both sides of each of the dummy merge part 61 and 62. For example, the first sub dummy part 63 is extended at one side of the first dummy merge part 61, and the second sub dummy part 64 is extended at one side of the second dummy merge part 62. An extended length L2 of the sub-dummy parts 63 and 64 may correspond to a width W3 of one pixel row in the Y axis direction, but is not limited thereto.

In the dummy pattern DP2 as described above, each of the dummy merge parts 61 and 62 has area larger than that of each of the sub-dummy parts 63 and 64, so that a relatively large amount of solution is dropped on the dummy merge parts 61 and 62. In addition, since the area in a region where the dummy merge parts 61 and 62 are connected is the largest in the dummy merge parts 61 and 62, the amount of solution dropped in the corresponding region may be relatively large.

Referring to FIG. 11, by the above-described mutual tension, the solutions dropped on the sub-dummy parts 63 and 64 receive tension in the direction of the connected dummy merge parts 61 and 62. A part of the solutions dropped on the sub-dummy parts 63 and 64 may move toward the dummy merge parts 61 and 62 and thus combined with the solutions dropped on the dummy merge parts 61 and 62.

Solutions dropped on the dummy merge parts 61 and 62 and solutions introduced into the dummy merge parts 61 and 62 from the sub-dummy parts 63 and 64 receive tension in the direction of a region B where the dummy merge parts 61 and 62 are connected. As a result, the largest amount of solutions may be applied to the region B of the dummy pattern DP2. When the solutions are dried, the drying rate in the region B having a larger amount of solutions is relatively slow. As the solution dries relatively slowly in the region B adjacent to the outermost region of the display panel 50, it is possible to prevent dewetting in the direction of the display region AA.

Figure 12:
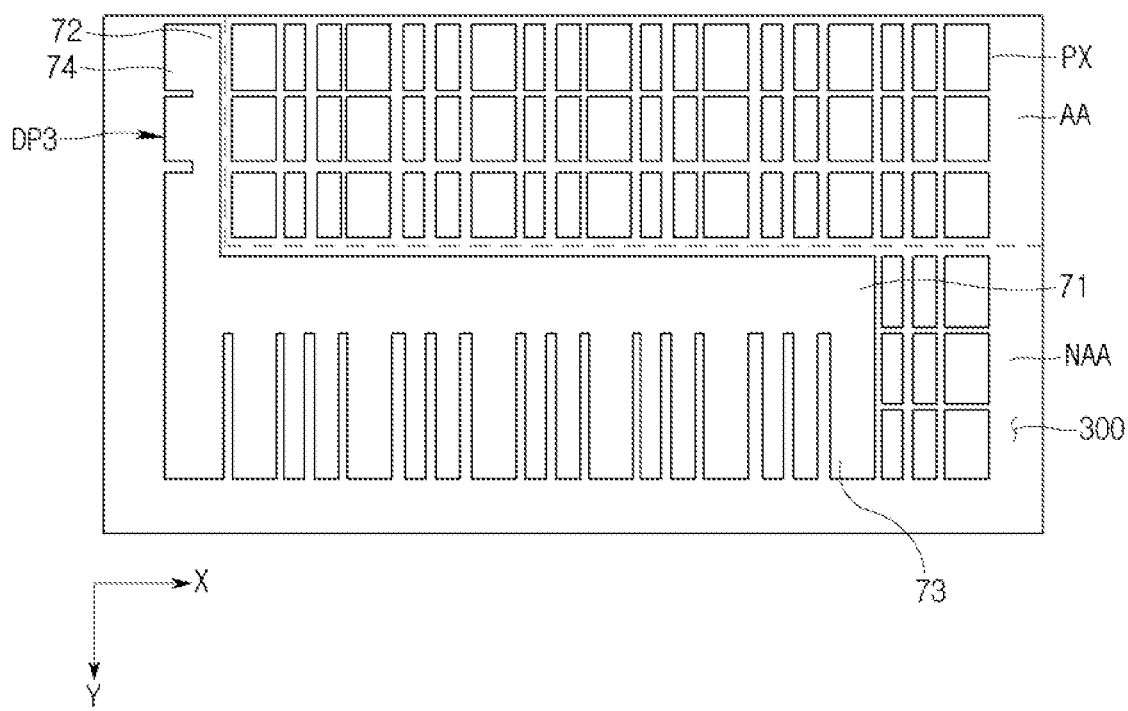
FIG. 12 is a plan view illustrating a dummy pattern according to a third aspect of the present disclosure.
Figure 13:
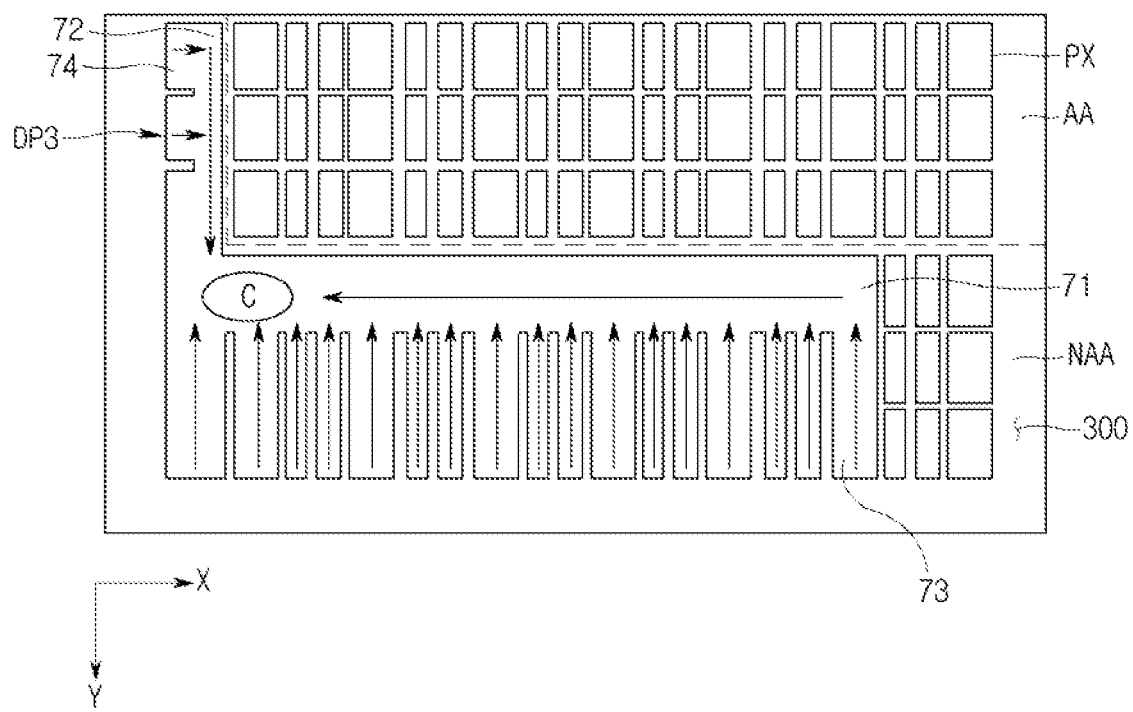
FIG. 13 is a view illustrating an aggregation direction of the solution in the dummy pattern shown in FIG. 12.

FIG. 12 is a plan view illustrating a dummy pattern according to a third aspect. FIG. 13 is a view illustrating an aggregation direction of the solution in the dummy pattern shown in FIG. 12.

According to the third aspect, the dummy pattern DP3 includes a first dummy merge part 71 extending in the X axis direction and a second dummy merge part 72 extending in the Y axis direction. One end of each of the first dummy merge part 71 and the second dummy merge part 72 are connected to each other.

The dummy pattern DP3 includes first sub-dummy parts 73 extending from one side of the first dummy merge part 71 to the outer region of the display panel 50 along the Y axis and a second sub-dummy part 74 extending from one side of the second dummy merge part 72 to the outer region of the display panel 50 along the X axis. According to an aspect, the width of the second sub dummy portions 74 in the Y axis direction may correspond to a width of each pixel row in the Y axis direction.

Referring to FIG. 13, by the above-described mutual tension, the solutions dropped on the sub-dummy parts 73 and 74 receive tension in the direction of the connected dummy merge parts 71 and 72. A part of the solutions dropped on the sub-dummy parts 73 and 74 may move toward the dummy merge parts 71 and 72 and thus combined with the solutions dropped on the dummy merge parts 71 and 72.

The solutions dropped on the dummy merge parts 71 and 72 or introduced into the dummy merge parts 71 and 72 from the sub-dummy parts 73 and 74 receive tension in the direction of a region C where the dummy merge parts 71 and 72 are connected. As a result, the largest amount of solutions may be applied to the region C of the dummy pattern DP3. When the solution dries, the drying rate in the region C having a larger amount of solutions is relatively slow. As the solution dries relatively slowly in the region C adjacent to the outermost region of the display panel 50, it is possible to prevent dewetting in the direction of the display region AA.

Figure 14:
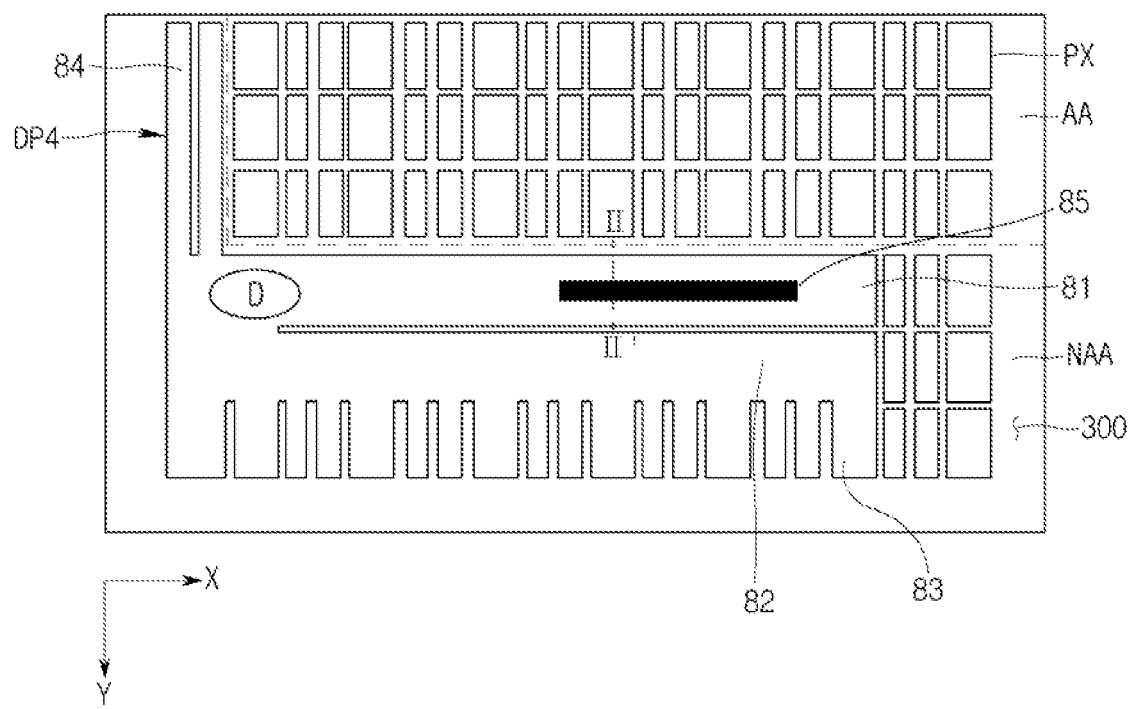
FIG. 14 is a plan view illustrating a dummy pattern according to a fourth aspect of the present disclosure.
Figure 15:
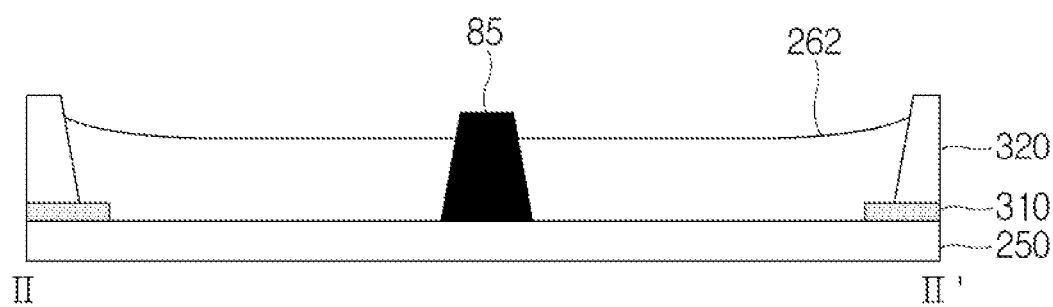
FIG. 15 is a cross-sectional view taken along line II-II' of FIG. 14.

FIG. 14 is a plan view illustrating a dummy pattern according to a fourth aspect. FIG. 15 is a cross-sectional view taken along a line II-II' of FIG. 14.

Compared to the aspect illustrated in FIG. 10, in the fourth aspect, a partition wall 85 is formed in a first dummy merge part 81 of the dummy pattern DP4. The partition wall has a bar shape extending along the X axis direction in the first dummy merge part 81. Herein, an extended length of the partition wall is shorter than an extended length of the first dummy merge part 81.

The partition wall 85 is arranged to be spaced apart from a region where the first dummy merge part 81 and the second dummy merge part 82 are connected. For example, when one end of the first dummy merge part 81 is connected to the second dummy merge part 82, the partition wall 85 may be disposed adjacent to the other end of the first dummy merge part 81.

According to an aspect, the partition wall 85 may have hydrophobic properties. When the partition wall 85 is hydrophobic, because the tension between the partition wall 85 and the solution is relatively small, solutions dropped on the other end of the first dummy merge part 81 may receive a greater tension in the direction of a region D by the partition wall 85. Therefore, a larger amount of solutions dropped on the first dummy merge part 81 may move to the region D, and thus a larger amount of solution may be applied to the region D. As a result, according to the fourth aspect, it is possible to prevent dewetting of the solution efficiently through the dummy pattern DP4.

According to an aspect, the partition wall 85 may be formed of the same material as the second bank 320. In this aspect, the partition wall 85 and the second bank 320 may be formed through a single process.

However, depending on aspects, the shape of the partition wall 85 (e.g., height, width, etc.) may be the same as or different from the second bank 320. The shape of the partition wall 85 may be of any shape, as long as the flow of the solution is not disturbed in the first dummy merge part 81.

Meanwhile, FIG. 14 shows that the partition wall 85 is formed only on the first dummy merge part 81, but the present aspect is not limited thereto. That is, in various aspects, the partition wall 85 may be formed on all of the dummy merge parts 81 and 82, and the present aspect may be applied even to a structure in which only one dummy merge part is provided.

Figure 16:
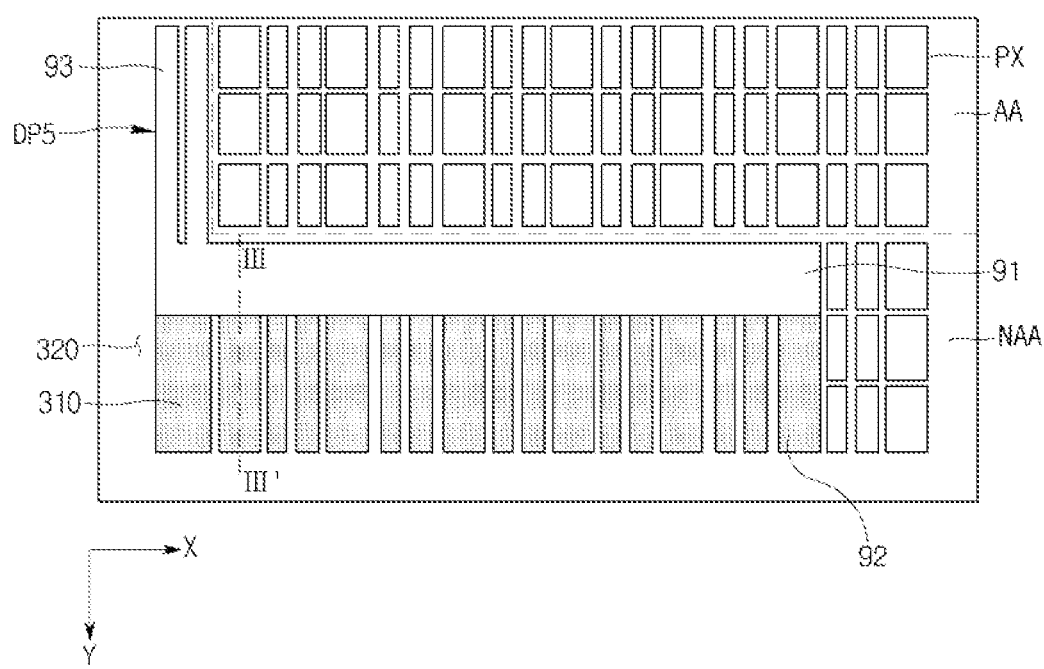
FIG. 16 is a plan view illustrating a dummy pattern according to a fifth aspect of the present disclosure.
Figure 17:
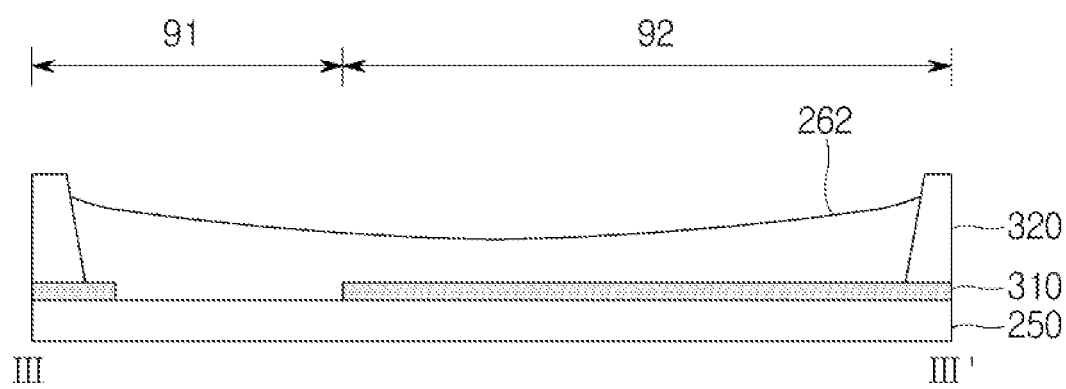
FIG. 17 is a cross-sectional view taken along line III-III' of FIG. 16.

FIG. 16 is a plan view illustrating a dummy pattern according to a fifth aspect. FIG. 17 is a cross-sectional view taken along a line III-III' of FIG. 16.

According to the fifth aspect, the dummy pattern DP5 includes dummy merge parts 91 extending in the X axis direction and a plurality of sub-dummy parts 92 and 93 extending in the Y axis direction from one side of the dummy merge part 91. Since the dummy pattern DP5 according to the fifth aspect has substantially the same shape as the dummy pattern DP described with reference to FIG. 6, a detailed description thereof will be omitted.

As described with reference to FIG. 4, a bank 300 may be a layer defining a shape of the dummy pattern DP in the non-display area NAA. That is, the light emitting layer 262 of the dummy pattern DP may be surrounded by the bank 300. The bank 300 is a first bank 310 having hydrophilic properties and a second bank 320 having hydrophobic properties.

According to the fifth aspect, the first bank 310 is formed inside the sub dummy parts 92. Then, the height of the top surface in the sub dummy portions 92 is higher than that of the top surface of the dummy merge part 91 by the first bank 310.

Due to a difference in height of the top surface between the sub dummy parts 92 and the dummy merge part 91, the solutions dropped on the sub dummy parts 92 have greater mobility in the direction of the dummy merge part 91. Compared to the aspect shown in FIG. 6, a larger amount of solutions may be applied to the dummy merge part 91 in the fifth aspect. As a result, according to the fifth aspect, it is possible to prevent dewetting of the solution efficiently through the dummy pattern DP5.

Meanwhile, in FIG. 16, the first bank 310 is shown to be formed only in partial sub dummy parts 92 of the sub dummy parts 92 and 93, but the present aspect is not limited thereto. That is, in other aspects, the first bank 310 may be formed for all the sub dummy parts 92 and 93.

Those of ordinary skill in the art to which the present disclosure pertains will appreciate that the present disclosure may be implemented in other specific forms without changing its technical spirit or essential features. Therefore, it should be understood that the aspects described above are illustrative in all respects and not restrictive. It should be interpreted that the scope of the present disclosure is indicated by the scope of the claims, which will be described later, rather than the detailed description, and all the modified or modified forms derived from the meaning and scope of the claims and their equivalent concepts are included in the scope of the present disclosure.

What is claimed is:

1. A display device, comprising:
   a substrate including a display area in which pixels are disposed and a non-display area in which a dummy pattern is disposed and surrounding the display area;
   a light emitting layer disposed on the pixels and the dummy pattern; and
   a bank surrounding the light emitting layer,
   wherein the dummy pattern includes:
   a first dummy merge part extended along at least one pixel column disposed in the display area; and
   first sub-dummy parts extended from one side of the first dummy merge part to an outer region of the substrate, and
   wherein the light emitting layer is integrally formed for the pixels and the dummy pattern.

2. The display device of claim 1, wherein the first sub-dummy parts are disposed corresponding to each of pixel columns.

3. The display device of claim 1, wherein a width of the first dummy merge part corresponds to a width of one pixel row, and a length of the first sub-dummy parts corresponds to a length of two or more pixel rows.

4. The display device of claim 1, wherein an area of the first dummy merge part is larger than those of the first sub-dummy parts.

5. The display device of claim 1, wherein the dummy pattern further includes second sub-dummy parts extended from the other side of the first dummy merge part to the outer region of the substrate.

6. The display device of claim 5, wherein the first sub-dummy parts are disposed in one region of the first dummy merge part, and the first sub-dummy parts and the second sub-dummy parts are disposed in the other region of the first dummy merge part.

7. The display device of claim 1, wherein the dummy pattern further includes:
   a second dummy merge part disposed parallel to the first dummy merge part; and
   second sub-dummy parts extended from one side of the second dummy merge part to the outer region of the substrate.

8. The display device of claim 7, wherein the first dummy merge part and the second dummy merge part are connected to each other in one region.

9. The display device of claim 8, wherein in the one region, the first sub-dummy parts are formed in the first dummy merge part, and the second sub-dummy parts are formed in the second dummy merge part.

10. The display device of claim 9, wherein the dummy pattern further includes a bar-shaped partition wall extended along the at least one pixel column.

11. The display device of claim 10, wherein the partition wall is spaced apart from the one region where the first dummy merge part and the second dummy merge part are connected to each other.

12. The display device of claim 10, wherein the partition wall has a hydrophobic property.

13. The display device of claim 1, wherein the dummy pattern further includes:
   a third dummy merge part extended perpendicular to the first dummy merge part; and
   third sub-dummy parts extended from one side of the third dummy merge part to the outer region of the substrate.

14. The display device of claim 13, wherein the third sub-dummy parts are disposed to correspond to each of pixel rows.

15. The display device of claim 14, wherein a width of the third sub-dummy parts corresponds to a width of one pixel row.

16. The display device of claim 1, wherein the bank includes:
   a first bank having a hydrophilic property; and
   a second bank disposed on the first bank and having at least one region with a hydrophobic property.

17. The display device of claim 16, wherein the first bank is extended from the non-display area into the first sub-dummy parts.

18. The display device of claim 1, wherein the light emitting layer is formed integrally in such a manner as to extend from any pixel column into the dummy pattern.

19. The display device of claim 1, wherein an edge region of the light emitting layer adjacent to the bank has a thickness larger than that of a center region of the light emitting layer far from the bank.

20. The display device of claim 1, further comprising:
   at least one circuit element disposed on the substrate in the display area;
   an overcoat layer covering the at least one circuit element;
   an anode electrode disposed on the overcoat layer in the display area and having an edge covered by the bank; and
   a cathode electrode covering the light emitting layer and the bank, wherein the light emitting layer is disposed on the anode electrode in the display area and disposed on the dummy pattern in the non-display area.

\* \* \* \* \*